US006222382B1

(12) United States Patent
Jefferson et al.

(10) Patent No.: US 6,222,382 B1
(45) Date of Patent: *Apr. 24, 2001

(54) REDUNDANCY CIRCUITRY FOR PROGRAMMABLE LOGIC DEVICES WITH INTERLEAVED INPUT CIRCUITS

(75) Inventors: David E. Jefferson, San Jose; Srinivas T. Reddy, Fremont, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/527,903

(22) Filed: Mar. 17, 2000

Related U.S. Application Data

(63) Continuation of application No. 09/082,081, filed on May 20, 1998, now Pat. No. 6,107,820.
(60) Provisional application No. 60/047,610, filed on May 23, 1997.

(51) Int. Cl.[7] .................................................. G06F 7/38

(52) U.S. Cl. ................................ 326/38; 326/10; 326/39

(58) Field of Search ................................. 326/10, 38, 39, 326/41

(56) References Cited

U.S. PATENT DOCUMENTS

| 3,566,153 | 2/1971 | Spencer, Jr. et al. ................ 307/205 |
| 3,805,039 | 4/1974 | Stiffler ............................ 235/153 AE |
| 3,995,261 | 11/1976 | Goldberg ...................... 340/173 BB |

(List continued on next page.)

FOREIGN PATENT DOCUMENTS

| 351983 A3 | 1/1990 | (EP) ............................... G06F/11/20 |
| 361404 A3 | 4/1990 | (EP) ............................... G06F/11/20 |
| 437081 A2 | 7/1991 | (EP) ............................... G06F/11/20 |
| 596453 A2 | 5/1994 | (EP) ............................... G06F/11/20 |

OTHER PUBLICATIONS

"A Survey of Microcelluar Research", R.C.Minnick, Journal of the Association of Computing Machinery, vol. 14, No. 2, pp. 203–241, Apr. 1967.

"Programmable Logic Arrays—Cheaper by the Millions," S.E. Wahlstrom, Electronics, Dec. 1967, pp. 90–95.

"Recent Developments in Switching Theory", A. Mukhopadhyay, ed., Academic Press, New York, 1971, chapters VI and IX, pp. 229–254 and 369–422.

"Memories and Redundancy Techniques", K. Kokkonen et al., Digest of Technical Papers, IEEE International Solid–State Circuits Conference, pp. 80–81, Feb. 1981.

"Cost–Effective Yield Improvement in Fault–Tolerant VLSI Memory", J. Bindels et al., Digest of Technical Papers, IEEE International Solid–State Circuits Conference, pp. 82–83, Feb. 1981.

(List continued on next page.)

*Primary Examiner*—Michael Tokar
*Assistant Examiner*—Anh Tran
(74) *Attorney, Agent, or Firm*—Fish & Neave; Robert R. Jackson; Pejman Sharifi

(57) ABSTRACT

Redundant circuitry is provided for a programmable logic device that uses an interleaved input multiplexer circuit arrangement. The programmable logic device has at least one row of logic regions and has multiple columns, each of which contains one of the interleaved input multiplexers and one of the logic regions. A set of conductors associated with the row of logic regions is used to convey signals between the logic regions. Each interleaved logic region distributes logic signals from the conductors in the row to two adjacent logic regions. Bypass circuitry is provided in each column for bypassing the interleaved input multiplexer and logic region in that column. If a defect is detected in a column during testing of the device, the manufacturer can repair the device using the bypass circuitry to bypass that column. Spare logic is provided to replace the circuitry lost when a defective column is bypassed.

17 Claims, 7 Drawing Sheets

U.S. PATENT DOCUMENTS

| | | | |
|---|---|---|---|
| 4,020,469 | 4/1977 | Manning | 340/172.5 |
| 4,051,354 | 9/1977 | Choate | 235/312 |
| 4,124,899 | 11/1978 | Birkner et al. | 364/716 |
| 4,380,811 | 4/1983 | Götze et al. | 371/10 |
| 4,538,247 | 8/1985 | Venkateswaran | 365/230 |
| 4,551,814 | 11/1985 | Moore et al. | 364/716 |
| 4,566,102 | 1/1986 | Hefner | 371/11 |
| 4,609,986 | 9/1986 | Hartmann et al. | 364/200 |
| 4,617,479 | 10/1986 | Hartmann et al. | 307/465 |
| 4,641,285 | 2/1987 | Sasaki et al. | 365/210 |
| 4,677,318 | 6/1987 | Veenstra | 307/465 |
| 4,691,301 | 9/1987 | Anderson | 365/200 |
| 4,700,187 | 10/1987 | Furtek | 340/825.83 |
| 4,703,206 | 10/1987 | Cavlan | 307/465 |
| 4,706,216 | 11/1987 | Carter | 365/94 |
| 4,713,792 | 12/1987 | Hartmann et al. | 364/900 |
| 4,722,084 | 1/1988 | Morton | 371/9 |
| 4,774,421 | 9/1988 | Hartmann et al. | 307/465 |
| 4,791,319 | 12/1988 | Tagami et al. | 307/441 |
| 4,798,976 | 1/1989 | Curtin et al. | 307/441 |
| 4,800,302 | 1/1989 | Marum | 307/441 |
| 4,829,198 | 5/1989 | Maley et al. | 307/441 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 4,920,497 | 4/1990 | Upadhyaya et al. | 364/491 |
| 4,928,022 | 5/1990 | Marum | 307/241 |
| 5,019,736 | 5/1991 | Furtek | 307/465 |
| 5,045,720 | 9/1991 | Bae | 307/441 |
| 5,121,006 | 6/1992 | Pedersen | 307/465 |
| 5,163,023 | 11/1992 | Ferris et al. | 365/200 |
| 5,187,393 | 2/1993 | El Gamal et al. | 307/465.1 |
| 5,204,836 | 4/1993 | Reed | 365/200 |
| 5,220,214 | 6/1993 | Pedersen | 307/465 |
| 5,237,219 | 8/1993 | Cliff | 307/465 |
| 5,255,227 | 10/1993 | Haeffele | 365/200 |
| 5,255,228 | 10/1993 | Hatta et al. | 365/200 |
| 5,260,610 | 11/1993 | Pedersen et al. | 307/465 |
| 5,260,611 | 11/1993 | Cliff et al. | 307/465 |
| 5,325,334 | 6/1994 | Roh et al. | 365/201 |
| 5,369,314 | 11/1994 | Patel et al. | 326/13 |
| 5,426,379 | 6/1995 | Trimberger | 326/39 |
| 5,434,514 | 7/1995 | Cliff et al. | 326/12 |
| 5,459,342 | 10/1995 | Nogami et al. | 257/209 |
| 5,471,427 | 11/1995 | Murakami et al. | 365/200 |
| 5,483,178 | 1/1996 | Costello et al. | 326/41 |
| 5,485,102 | 1/1996 | Cliff et al. | 326/10 |
| 5,498,975 | 3/1996 | Cliff et al. | 326/10 |
| 5,508,636 | 4/1996 | Mange et al. | 326/38 |
| 5,592,102 | 1/1997 | Lane et al. | 326/10 |
| 5,670,895 | 9/1997 | Kazarian et al. | 326/39 |
| 6,123,521 | 9/2000 | Mori et al. | 364/200 |

OTHER PUBLICATIONS

"A 100ns 64K Dynamic RAM using Redundancy Techniques", S. Eaton et al., Digest of Technical Papers, IEEE International Solid–State Circuits Conference, pp. 84–85, Feb. 1981.

"Introducing Redundancy In Field Programmable Gate Arrays", F. Hatori et al., Proceedings of the IEEE 1993 Custom Integrated Circuits Conference, pp. 7.1.1–7.1.4, May 1993.

"On the Design of a Redundant Programmable Logic Array (RPLA)", C.–L. Wey et al., IEEE Journal of Solid State Circuits, vol. SC–22, No. 1, Feb. 1987, pp. 114–117.

Preliminary Data booklet for Altera 32 Macrocell High Density Max EPLD EPM5032, 1988, Altera Corporation.

"Programmable Logic Devices with Spare Circuits for Use in Replacing Defective Circuits", Altera Corporation.

"Laser Correcting Defects to Create Transparent Routing for Larger Area FPGA's", G.H. Chapman and B. Dufort, FPGA '97—ACM/SIGDA International Symposium on Field Programmable Gate Arrays, 1997, pp. 17–23.

REDUNDANCY CIRCUITRY FOR PROGRAMMABLE LOGIC DEVICES WITH INTERLEAVED INPUT CIRCUITS

This application is continuation of U.S. patent application Ser. No. 09/082,081, filed May 20, 1998, "U.S. Pat. No. 6,107,820," hereby incorporated by reference herein in its entirety, which claims the benefit of U.S. provisional application No. 60/047,610, filed May 23, 1997.

BACKGROUND OF THE INVENTION

This invention relates to programmable logic devices, and more particularly, to redundancy circuitry for repairing programmable logic devices containing defects.

Programmable logic devices are integrated circuits that may be programmed to perform custom logic functions. Integrated circuit fabrication techniques are not perfect, so occasionally a programmable logic device may be fabricated with a defect. Unless the defect can be repaired before the logic device is put into use, the logic device must be discarded. Discarding such a device is wasteful, particularly when a defect is relatively minor. As a result, various redundancy schemes have been developed that allow spare circuitry to be switched into place to repair a defective portion of a circuit.

The difficulty of implementing a suitable redundancy scheme for a given logic device architecture depends on the attributes of the architecture. For example, there are difficulties associated with providing redundancy for programmable logic devices that use interleaved multiplexer circuitry to distribute signals to logic array blocks. Because adjacent logic array blocks share signal routing resources in such arrangements, the occurrence of a defect in one logic array block can affect an adjacent and otherwise defect-free logic array block. Although it might be possible to use a redundancy scheme in which both of these affected logic array blocks are replaced upon detection of a defect, such a scheme would necessarily involve bypassing at least one defect-free logic array block. A redundancy scheme that uses logic resources more efficiently would be desirable.

It is therefore an object of the present invention to provide a redundancy arrangement for programmable logic devices with interleaved input circuits.

SUMMARY OF THE INVENTION

This and other objects of the invention are accomplished in accordance with the principles of the present invention by providing redundant circuitry for a programmable logic device that uses interleaved input multiplexer circuits to distribute signals to adjacent logic regions. The programmable logic device has at least one row of logic regions and has multiple columns, each of which contains one of the interleaved input multiplexers and one of the logic regions. A set of conductors associated with the row of logic regions is used to convey signals between logic regions.

Each interleaved input multiplexer circuit distributes logic signals from the conductors in the row to two adjacent logic regions. One of the logic regions to which the signals are distributed is in the same column as the interleaved input multiplexer circuit. The other logic region to which the signals are distributed is in an adjacent column.

Bypass circuitry is provided in each column for bypassing the interleaved input multiplexer and logic region in that column. During manufacturing of the device, the device is tested to determine if any of the columns contain defective circuitry. If a defect is detected in a column, the manufacturer can repair the device by configuring the bypass circuitry to bypass that column during use of the device.

During programming of the programmable logic device, a user supplies programming data to the device that directs the various logic components on the device to perform desired logical functions. If a column of circuitry contains a defect, circuitry previously configured by the manufacturer shifts the programming data originally intended for that column into an adjacent column. The programming data originally intended for the adjacent column and each successive column of logic in the row is also shifted.

A spare column of logic is provided at the end of the row to receive the shifted programming data from the last column of regular logic when the programming data for the various columns of logic is being shifted to accommodate the bypassing of a defective column. The spare logic makes up for the logic that is lost when the defective column is bypassed. As a result, the same number of logic regions are used regardless of whether the device is repaired following detection of a defect or was defect free initially.

Outputs from the logic regions are applied to the conductors using programmable drivers. The drivers associated with each column typically form a unique pattern of connections to the conductors. When programming data is shifted to a successive column during repair of a defect, the programming data associated with the drivers is also shifted to the successive column. In one arrangement, the programmable logic device uses programming data redirecting circuitry to redirect the shifted programming data for the drivers back to the drivers in the original column. In another arrangement, auxiliary drivers are provided in each column. The auxiliary drivers in each column form the same pattern of connections to the conductors that are formed by the normal drivers in the previous column. When a column containing a defect is repaired, the auxiliary drivers in successive columns are used in place of the normal drivers to ensure that the outputs of the logic regions in the successive columns are directed to the same destinations that they would have been directed to had the programming data not been shifted.

The logic regions are preferably programmable logic array blocks, each of which contains a plurality of programmable logic elements based on a four-input look-up table or based on product term logic.

Two sets of logic array blocks may be provided in a row. In this type of arrangement, a single spare logic array block may be provided in the center of the row. This reduces the overhead associated with redundancy, because the two sets of logic array blocks in the row can share the spare logic array block.

Further features of the invention, its nature and various advantages will be more apparent from the accompanying drawings and the following detailed description of the preferred embodiments.

DETAILED DESCRIPTION OF THE PREFERRED EMBODIMENTS

Programmable logic devices are integrated circuits that contain logic that may be reconfigured or "programmed" by a user to perform custom logic functions. At their most basic level, programmable logic devices are based on programmable switches or connectors. Such programmable components may use random-access memory, read-only memory, erasable programmable read-only memory, electrically-erasable programmable read-only memory, fuses, antifuses, ferro-electric elements, or other suitable programmable component technology.

Programmable logic devices that contain redundant or spare circuitry may be configured by a manufacturer during the manufacturing process to repair portions of the circuit that are determined to be defective.

Figure 1:
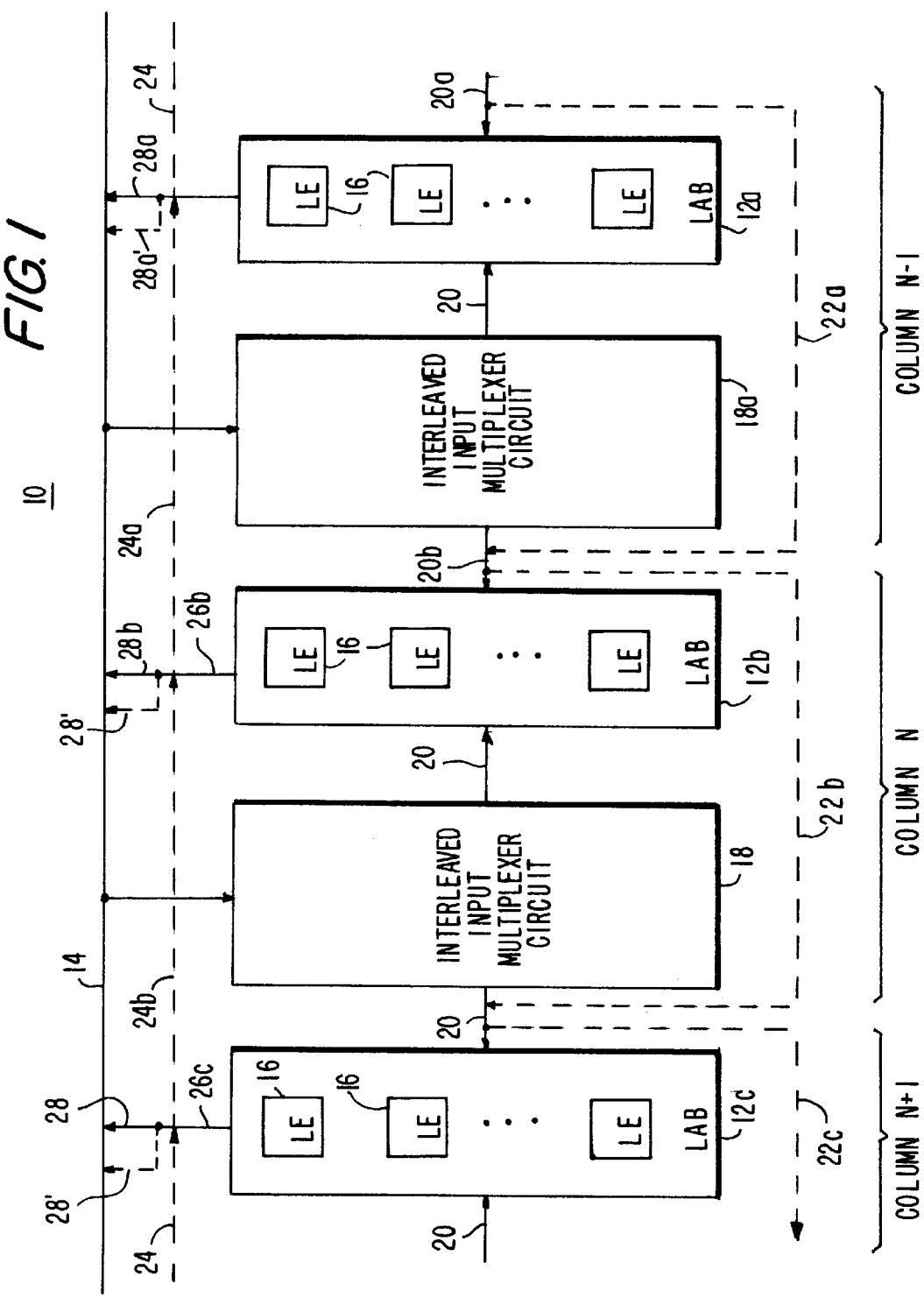
FIG. 1 is a circuit diagram of a portion of an illustrative programmable logic device with a redundancy arrangement in accordance with the present invention.

A programmable logic device integrated circuit having a redundancy arrangement in accordance with the present invention is shown in FIG. 1. Programmable logic device 10 preferably has one or more rows of logic array blocks 12, although the principles of the invention are applicable to programmable logic devices containing any suitable type of programmable logic region. The logic array blocks 12 in a row are interconnected by horizontal conductors 14. If more than one row of logic array blocks 12 is desired, suitable vertical conductors and associated programmable routing circuitry (not shown) may be used to convey logic signals between rows. To avoid over-complicating the drawings, only a single row of logic array blocks 12 is shown in FIG. 1. In addition, not all of the components of logic device 10 are shown in FIG. 1. For example, details of the input/output circuitry for device 10 are not shown in FIG. 1.

Each logic array block 12 preferably contains a number of programmable logic elements 16. Logic elements 16 and other programmable logic circuitry in programmable logic device 10 may be programmed by a user to perform various logic functions. Logic elements 16 may be based on look-up table logic, product term logic, or any other suitable type of programmable logic. If desired, logic elements 16 may contain register logic for registering various logic signals.

Programmable logic device 10 has multiple columns each of which contains a logic array block 12 and an interleaved input multiplexer circuit 18. Interleaved multiplexer circuits 18 are used to distribute logic signals from horizontal conductors 14 to logic array blocks 12. Each interleaved input multiplexer circuit 18 distributes signals to two adjacent logic array blocks 12 via conductors 20. One of the array blocks 12 to which the signals are distributed is in the same column as the interleaved input multiplexer circuit 18. The other logic array block 12 to which the signals are distributed is in an adjacent column. Although conductors like conductors 14 and conductors 20 are depicted as single lines in FIG. 1, each such line typically represents multiple parallel signal conductors.

In each row of device 10 there is preferably at least one spare logic array block 12 and at least one spare interleaved input multiplexer circuit 18. The location of such spare circuitry within a row of logic array blocks 12 is not critical. For example, spare circuitry may be located at either end of a row or may be located in the center of a row if desired.

During the manufacturing process, device 10 is tested by the manufacturer. If a defect is located in one of logic array blocks 12 or one of interleaved input multiplexer circuits 18, device 10 may be repaired by replacing the logic array block 12 and interleaved input multiplexer circuit 18 in the defective column using the spare circuitry.

Replacing the defective circuitry typically involves configuring the device so that logic signals that were originally provided to the inputs of the defective circuitry are redirected to unaffected circuitry that is adjacent to the defective circuitry. For example, if it is determined that there is a defect located in the column containing logic array block 12a and interleaved input multiplexer circuit 18a (column N−1), bypass circuit 22a associated with that column may be used to redirect signals that would normally have been provided to inputs 20a of logic array block 12a to inputs 20b of logic array block 12b in column N. Bypass circuit 22b in column N, bypass circuit 22c in column N+1, and the bypass circuits in other columns are not used.

Each logic array block 12 in a row typically makes output connections to the horizontal conductors 14 in the row using a different pattern of drivers. As a result, replacing the defective circuitry also involves redirecting the outputs of some of the logic array blocks so that the outputs of the repaired row of logic array blocks are connected to horizontal conductors 14 in the same way that the outputs would have been connected to horizontal conductors 14 if the circuit had been defect free. This ensures that the output signals from each logic array block are directed to the same destinations that they would have been directed to had the circuit not contained a defect. A repaired circuit therefore works identically to a defect-free circuit.

For example, if it is determined that there is a defect located in logic array block 12a or interleaved input multiplexer circuit 18a in column N−1, output redirecting circuitry 24a may be used to redirect the signals at outputs 26b back to driver paths 28a. Because this allows the same pattern of driver connections to be used to connect outputs 26b to conductors 14 that would have been used to connect outputs 26a to conductors 14 had there been no defect, this arrangements ensures that the output signals from logic array block 12b are directed to the same destinations that the output signals from logic array block 12a would have been directed had logic array block 12a or interleaved input multiplexer circuit 18a not been defective.

Because outputs 26b of logic array block 12b are redirected to driver paths 28a, outputs 26c must be redirected to driver paths 28b by output redirecting circuit 24b. The outputs of the logic array blocks 12 in successive columns to the left of logic array block 12c use similar output redirecting circuits 24 to shift output signals to the output drivers in previous columns immediately to their right.

If desired, the original output driver patterns of a circuit can be preserved during replacement of defective circuitry using other output redirecting circuitry arrangements. For example, the output redirecting circuitry arrangement may have auxiliary driver paths 28' that can be used in place of the circuitry of normal driver paths 28. Each auxiliary driver path 28' uses same pattern of drivers to connect its associated logic array block outputs to conductors 14 that are used by the normal driver path 28 in the previous column.

If no defective circuitry is found, each logic array block is connected to conductors 14 using its associated normal driver path 28. If it is determined that a column contains a defect, the logic array blocks 12 to the right of the defective column are connected to conductors 14 using normal driver paths 28 and the logic array blocks 12 to the left of the defective column are connected to conductors 14 using auxiliary driver paths 28'. For example, if logic array block 12a is defective, the outputs of each logic array block 12 to the right of logic array block 12a are connected to conductors 14 using a respective one of normal driver paths 28. However, the outputs of logic array block 12b and each logic array block 12 to the left of logic array block 12b are connected to conductors 14 using auxiliary driver paths 28'.

Figure 2:
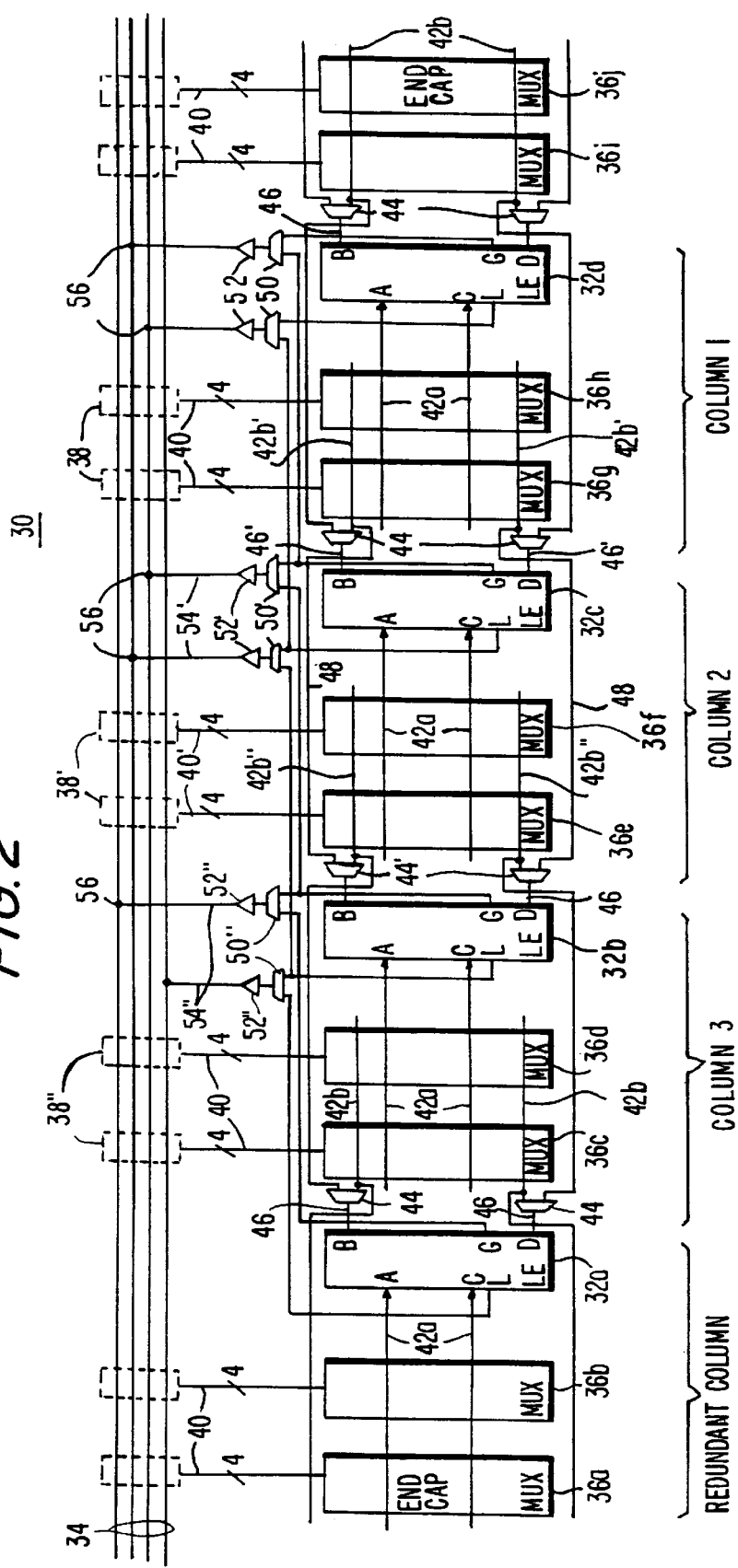
FIG. 2 is a more detailed circuit diagram of a portion of a programmable logic device of the type shown in FIG. 1.

FIG. 2 is a more detailed circuit diagram of a portion of a programmable logic device of the type shown in FIG. 1. The portion of the programmable logic device 30 shown in FIG. 2 has a single row and multiple columns of logic elements 32 that are interconnected by horizontal conductors 34. A number of such logic elements 32 in each column are preferably grouped together to form a logic array block in each column, as shown in FIG. 1. This level of detail is not shown in FIG. 2 to avoid over-complicating the drawings. Programmable logic device 30 also preferably contains multiple rows of such logic array blocks each of which contains the same type of logic element arrangement. The logic array blocks in other rows may be interconnected with the row of logic array blocks containing the row of logic elements 32 depicted in FIG. 2 using vertical conductors (not shown) to route signals between various rows of horizontal conductors 34. Although there are only four logic elements 32 in the row of logic elements 32 shown in FIG. 2, logic device 30 may have any suitable number of logic elements 32.

Logic elements 32 may be based on any suitable type of logic such as product term logic or look-up table logic and may contain register logic if desired. Logic elements 32 may have any suitable number of inputs and outputs. In the illustrative arrangement of FIG. 2, logic elements 32 have inputs A, B, C, and D, which may be, for example, the inputs to a standard four-input look-up table circuit. Logic elements 32 of FIG. 2 each have an L output and a G output which may be the outputs from a standard look-up table circuit.

Signals from horizontal conductors 34 are provided to input multiplexer circuits 36 by programmable multiplexers 38 and local vertical conductors 40. Input multiplexer circuits 36 preferably extend past all of the logic elements 32 in a given logic array block. Programmable multiplexers 38 may be programmed by a user of device 30 to connect selected horizontal conductors 34 to local vertical conductors 40. Local horizontal conductors 42 are used to direct signals from the input multiplexer circuits 36 to the logic elements 32.

Figure 3:
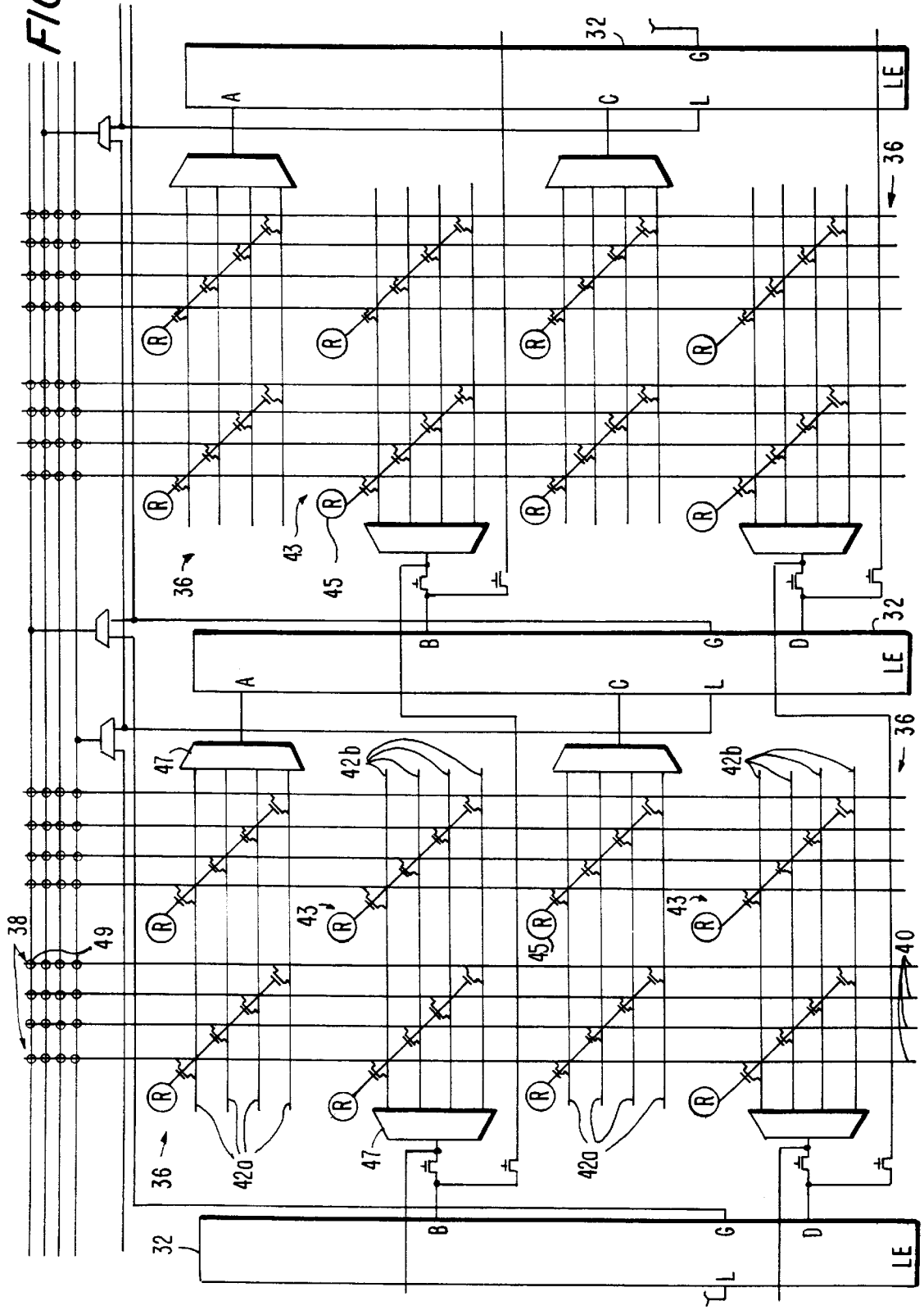
FIG. 3 is a circuit diagram of a portion of the programmable logic device of FIG. 2 showing the interleaved input multiplexer circuits in more detail.

An illustrative set of input multiplexer circuits 36 and logic elements 32 is shown in more detail in FIG. 3. As shown in FIG. 3, signals on the four local vertical conductors 40 associated with each input multiplexer circuit 36 may be selectively routed to the intersecting local horizontal conductors 42 by programmable connectors 43. The operation of programmable connectors 43 is controlled by data in storage cells 45.

Each multiplexer 47 directs one of the four horizontal conductors 42 connected to its input to an input of a logic element 32. Each programmable multiplexer 38 is preferably formed from a number of individual programmable connectors 49.

In the depicted embodiment of FIG. 2, there are four columns of logic elements 32. Logic elements 32b, 32c, and 32d are regular logic elements. Logic element 32a is a spare or redundant logic element 32. During the manufacturing process, device 30 is tested for defects. If it is determined that device 30 is defect free, spare logic element 32a need not be used. If a defect is located in a column, the defect can be bypassed by bypassing the logic in that column. In addition, the circuitry of spare logic element 32a can be shifted into place to replace circuitry lost in the bypassed column (i.e., the bypassed logic element).

Each logic element 32 can receive signals from four associated input multiplexer circuits 36. For example, logic element 32c may receive signals from input multiplexer circuits 36e and 36f (via the local horizontal conductors 42a connected to the A and C inputs of logic element 32c) and input multiplexer circuits 36g and 36h (via the local horizontal conductors 42b' connected to the B and D inputs of logic element 32c with multiplexers 44).

Adjacent input multiplexer circuits 36 are interleaved with one another because they share a common set of local horizontal conductors 42. For example, input multiplexer circuit 36e is interleaved with input multiplexer circuit 36f because the local horizontal conductors 42 that pass through input multiplexer 36e also pass through input multiplexer 36f.

Local horizontal conductors 42a supply signals from input multiplexer circuits 36 directly to logic element inputs A and C. Local horizontal conductors 42b supply signals from input multiplexer circuits 36 to logic element inputs B and D via bypass multiplexers 44.

During the manufacturing process, device 30 is tested to determine whether or not device 30 contains defective circuitry. If testing indicates that device 30 is defect free, no bypassing is needed. Bypass multiplexers 44 are therefore configured to pass signals from the local horizontal conductors 42b that are directly connected to their inputs to logic element inputs B and D via multiplexer outputs 46. If testing indicates that device 30 contains a defect in one of the logic elements 32 or input multiplexer circuits 36 in a column, the manufacturer configures the appropriate bypass multiplexers 44 so that the defective logic in that column is bypassed.

For example, if a defect is detected in logic element 32c or in interleaved input multiplexer circuits 36e or 36f of column 2, bypass multiplexers 44' may be configured to route the signals from local horizontal conductors 42b' to the B and D inputs of logic element 32b in column 3 via bypass conductors 48, rather than to the B and D inputs of logic element 32c of column 2 via outputs 46'.

The pathways that supply programming data to the logic of device 30 are preferably configured by the manufacturer so that the programming data with which the user programs device 30 is routed to the appropriate logic during device programming. For example, the programming data that would have been used for the programmable multiplexers 38' associated with interleaved input multiplexer circuits 36e and 36f had circuits 36e and 36f been used is directed to programmable multiplexers 38". The programming data that would have been used to configure logic element 32c is provided to logic element 32b. The programming data that would have been used to establish the pattern of programmable connections between local vertical conductors 40' and local horizontal conductors 42a and 42b" in interleaved input multiplexers 36e and 36f of column 2 is provided to interleaved input multiplexer circuits 36c and 36d of column 3.

Another change that is made when defective logic circuitry is bypassed relates to the paths of the logic element output signals provided to conductors 34. When there is no defective circuitry, the output multiplexers 50 that are associated with each logic element 32 direct the L and G outputs of that logic element 32 directly to horizontal conductors 34. For example, multiplexers 50' direct the L and G outputs of logic element 32c to horizontal conductors 34 via drivers 52' and paths 54' and multiplexers 50" direct the L and G outputs of logic element 32b to horizontal conductors 34 via drivers 52" and paths 54". When it is determined that device 30 contains defective circuitry, multiplexers 50 are configured so that the output signals are directed to the horizontal conductors 34 using the same driver patterns that were used when there was no defective circuitry.

For example, if a defect is detected in logic element 32c or in interleaved input multiplexer circuits 36e or 36f of column 2, multiplexers 50' and paths 58' are used to redirect the output signals from logic element 32b in column 3 to the drivers 52' associated with bypassed logic element 32c in column 2. Similarly, multiplexers 50" direct the outputs from spare logic element 32a in the redundant or spare column back to the drivers 52" that were originally associated with logic element 32b in column 3. This arrangement allows the pattern of connections 56 between paths 54 and horizontal conductors 34 that are associated with each set of drivers 52 to be preserved even if some of the circuitry on device 30 is rearranged during the replacement of defective circuitry by spare circuitry.

Each set of driver connections 56 typically drives a different pattern of horizontal conductors 34. As a result, preserving the pattern of driver connections 56 that are used ensures that the logic element output signals for a given logic element 32 reach their intended destinations.

Drivers 54 are preferably programmable to either an on state or an off state. If desired, each driver 54 can drive more than one conductor 34. Unlike the programming data for the logic element 32 and input multiplexer 36 in a defective column, which is shifted to a non-defective logic element 32 and a non-defective input multiplexer in an adjacent column, the programming data for the drivers in the defective column is ultimately not shifted. This is shown in FIG. 4.

Figure 4:
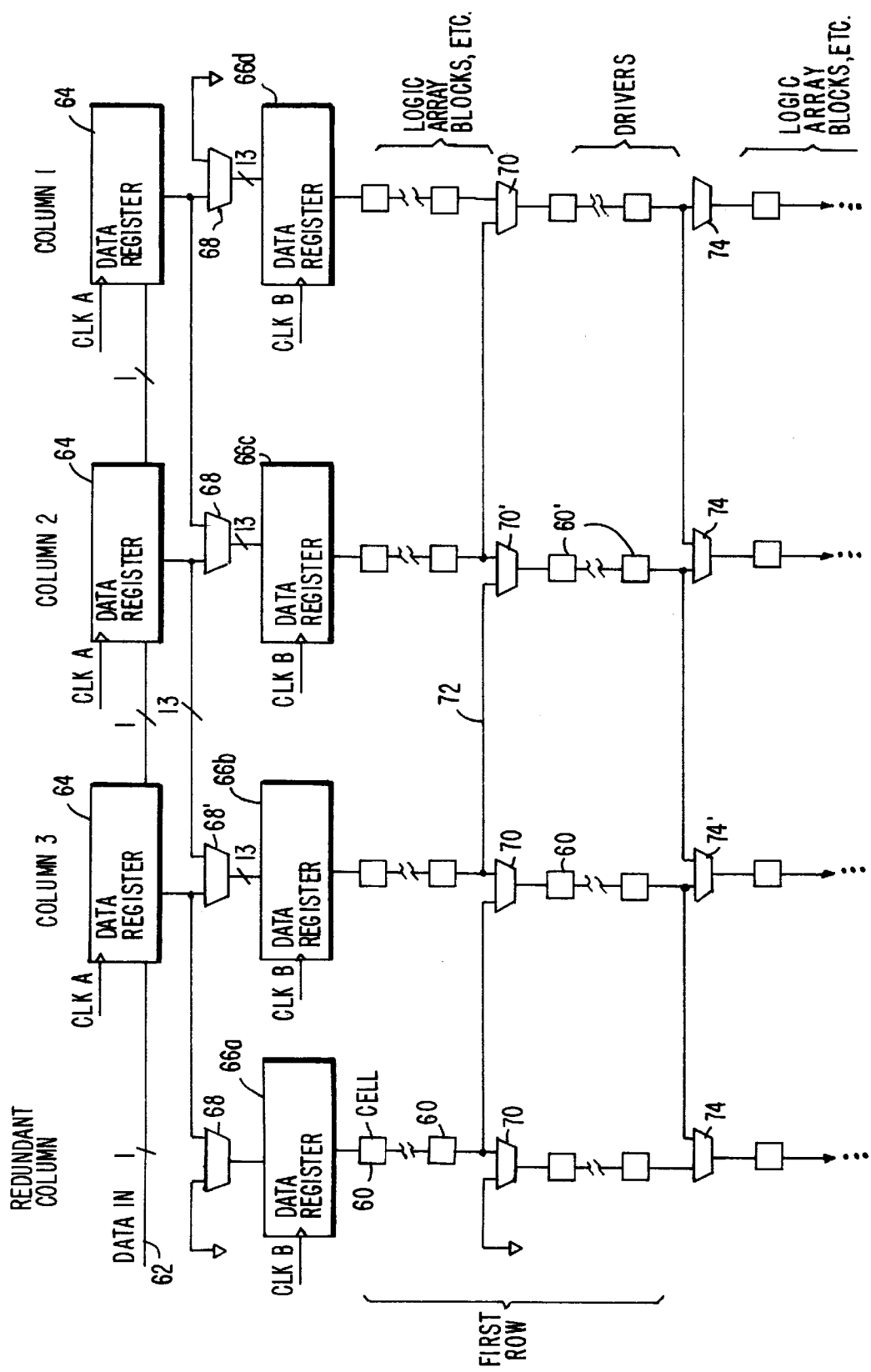
FIG. 4 is a circuit diagram showing the circuitry used to route programming data to various portions of the programmable logic device of the present invention.

The programming arrangement of FIG. 4 has multiple vertical chains of programming storage cells 60. The programming data loaded into storage cells 60 configures the programmable logic with which the cells 60 are associated. Each column of cells 60 is associated with a different column of logic elements 32, input multiplexer circuits 36, and programmable multiplexers 38 in device 30 in FIG. 2. For example, the redundant column of cells 60 of FIG. 4 may be associated with redundant logic element 32a of FIG. 2, column 3 of cells 60 may be associated with logic element 32b, column 2 of cells 60 may be associated with logic element 32c, and column 1 of cells 60 may be associated with logic element 32d.

To program the device, programming data supplied to input line 62 is serially clocked into the data registers 64. If no defective circuitry is detected, multiplexers 68 are configured to shift the programming data for columns 1, 2, and 3 into data registers 66b, 66c, and 66d. The programming data in registers 66b, 66c, and 66d is clocked into the vertical chains of cells 60 in columns 3, 2, and 1 respectively.

If defective circuitry is detected (e.g., in column 2), multiplexers 68 are configured to shift the programming data that would normally have traveled down the vertical chain of cells 60 in column 2 to column 3 and the programming data that would normally have traveled down the vertical chain of cells 60 in column 3 to the redundant or spare column. The programming data for column 1 is unaffected.

Shifting the programming data for logic elements 32, input multiplexer circuits 36, and programmable multiplexers 38 allows the logic functions originally to be performed by the circuitry that was found to be defective to be performed by defect-free circuitry. The multiplexer arrangement of FIG. 2 redirects the output signals of each shifted logic element back to the original column during use of the device so that the original drivers are used. This requires that the programming data for these drivers be shifted back to the original column containing the defective circuitry during device programming rather than remain in the column to which it was shifted.

As shown in FIG. 4, programming data for the various components of the device are loaded serially. For example, all of the programming data for the drivers in a row of logic array blocks may be loaded before loading the programming data for the logic elements, the input multiplexer circuits, and the programmable multiplexers 38 for that row. Shifting multiplexers 70 are used to selectively redirect the driver programming data back to the row in which that data was originally to be used before detection of the defect. For example, if column 2 contains a defective circuit, the programming data originally intended for the drivers in column 2 is shifted into column 3 with the rest of the shifted column 2 programming data by multiplexers 68', but is redirected back into column 2 and into the appropriate cells 60' via path 72 and multiplexer 70'.

Because programming data is loaded serially from the top of each columns of cells 60, configuring multiplexer 70' to redirect the programming data for the column 2 drivers back to column 2 from column 3 causes all the other programming data that passes through multiplexer 70'0 to be directed to column 2 even if that data is for column 3 circuitry. Multiplexer 74' is therefore used to ensure that the programming data that is directed back to column 2 by multiplexer 70 is directed back to column 3, so that the programmable logic associated with column 3 is programmed correctly. The other multiplexers 70 and 74 are also configured to direct the programming data for the drivers and other circuit components to the appropriate cells to program device 30.

Figure 5:
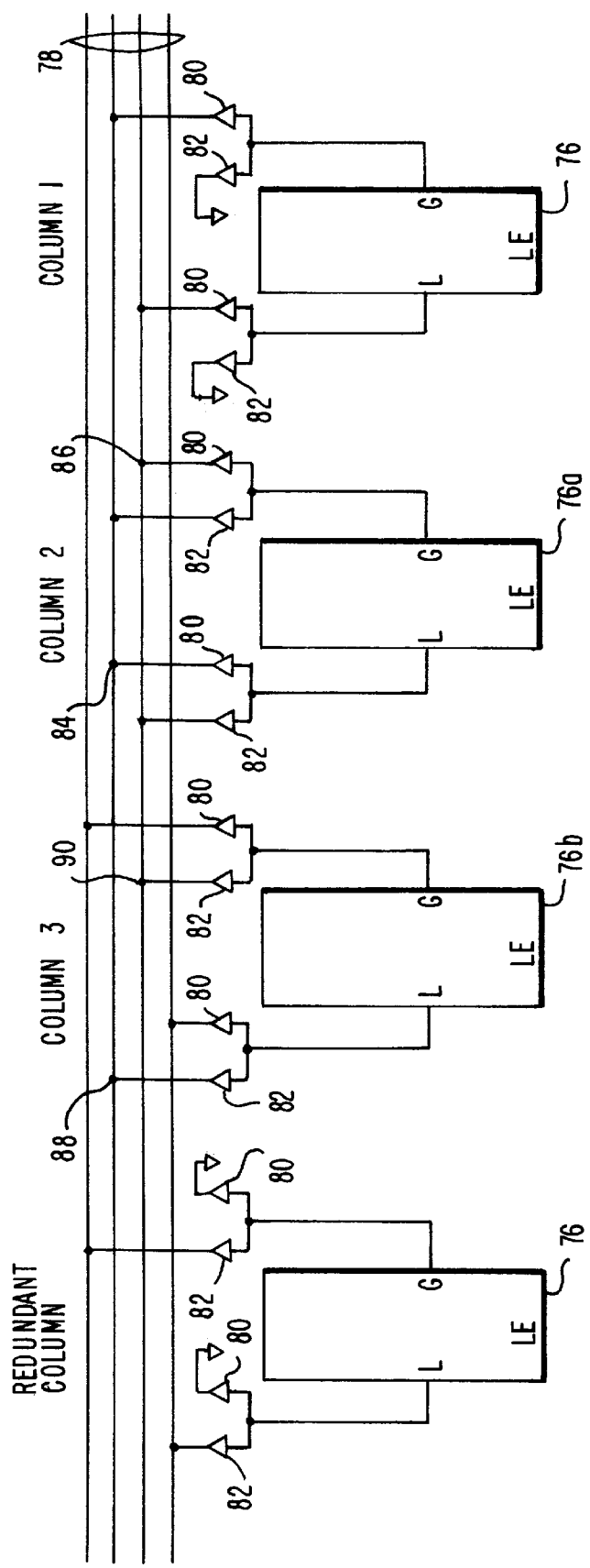
FIG. 5 is a circuit diagram showing the output driver connections that are made between logic array blocks and horizontal conductors in a programmable logic device in accordance with the present invention.

The programming data for drivers 52 does not need to be rerouted back to its original column if each column of logic is provided with an auxiliary set of drivers that may be used whenever logic is shifted during repair of a defective logic region. One suitable arrangement of this type is shown in FIG. 5. As shown in FIG. 5, the L and G outputs of logic elements 76 may be connected to horizontal conductors 78 through either normal drivers 80 or auxiliary drivers 82. If a column has no defects, then the outputs of the logic elements 76 in that column are provided to horizontal conductors 78 through the normal drivers 80.

For example, if there are no defects in the logic of column 2, the L and G outputs of logic element 76a are applied to horizontal conductors 78 via normal drivers 80 and connections 84 and 86. If there is a defect in column 2, the logic functions that are normally performed by the logic of logic element 76a are performed by logic element 76b. This is accomplished by configuring the device so that the programming data originally intended for the logic of column 2 is shifted into column 3 during device programming. In order to retain the same pattern of output driver connections in column 3 that would have been used in column 2, the L and G outputs of logic element 76b are applied to horizontal conductors 78 via auxiliary drivers 82 and connections 88 and 90.

The auxiliary drivers 82 associated with each column make the same connections to the horizontal conductors 78 as the normal drivers 80 associated with the previous column (i.e., the next column to the right). For example, connections 88 and 90, which are connections associated with the auxiliary drivers 82 for the L and G outputs in column 3, are connected to the same horizontal conductors as connections 84 and 86, which are connections associated with the regular drivers 80 for the L and G outputs in column 2. If column 2 contains a defect, the logic element 76 in column 1 uses normal drivers 80 and the logic element in column 2 is not used. The logic elements in column 3 and the redundant column use auxiliary drivers 82.

As shown in FIG. 2, input multiplexer circuits 36a and 36j are "end caps." End caps are active input multiplexer circuits that provide symmetry to the layout of device 30 and facilitate the programming of device 30 by reducing potential software fitting problems. Input multiplexer circuit 36a provides symmetry by balancing input multiplexer circuit 36d, which is located on the opposite side of logic element 32a and input multiplexer circuit 36j provides symmetry by balancing input multiplexer circuity 36g, which is located on the opposite side of logic element 32d.

If a defect is detected in an input multiplexer adjacent to an end cap, programming data is shifted somewhat differently than when a defect is detected in the middle of a row of logic elements. In particular, the programming data for four logic components (one logic element and three input multiplexer circuits) is shifted rather than the programming data for three components (one logic element and two input multiplexer circuits). For example, if a defect is detected in input multiplexer circuit 36i of device 30 in FIG. 2, the programming data for the following regions of logic is shifted: input multiplexer circuit 36i (shifted to input multiplexer circuit 36g), logic element 32d (shifted to logic element 32c), input multiplexer circuit 36h (shifted to input multiplexer 36f), and input multiplexer circuit 36g (shifted to input multiplexer circuit 36e). This switching arrangement is equivalent to shifting only the programming data associated with input multiplexer circuit 36i.

Figure 6:
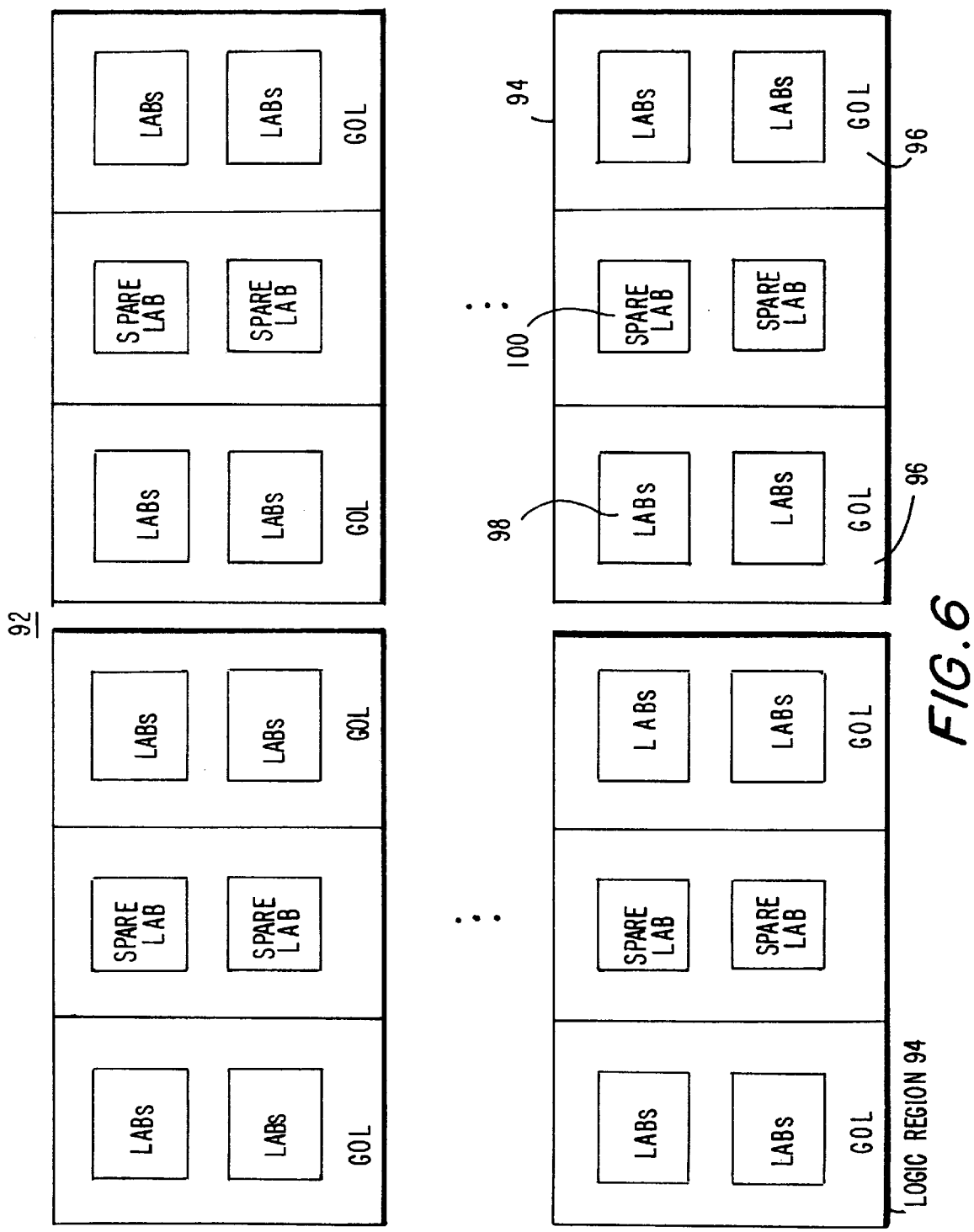
FIG. 6 is a circuit diagram showing an arrangement for reducing the overhead associated with providing redundancy in accordance with the present invention.

In certain situations it may be desirable to reduce the overhead costs associated with providing spare circuitry. As shown in FIG. 6, programmable logic array device 92 may be contain an array of logic regions 94, each of which has two groups of logic array blocks (GOLs) 96. Each GOL 96 contains two sets of logic array blocks 98. Spare logic array blocks 100 may be provided in the center of the two sets of logic array blocks 98 per row in each logic region 94. A redundancy scheme such as the one shown in FIG. 2 may be used to repair logic regions 94 using spare logic array blocks 100. Because spare logic array blocks 100 are centrally located, it is only necessary to provide a single spare logic array block 100 for each row containing two sets of logic array blocks 98, rather than providing two such spare logic array blocks 100, thereby reducing overhead.

Figure 7:
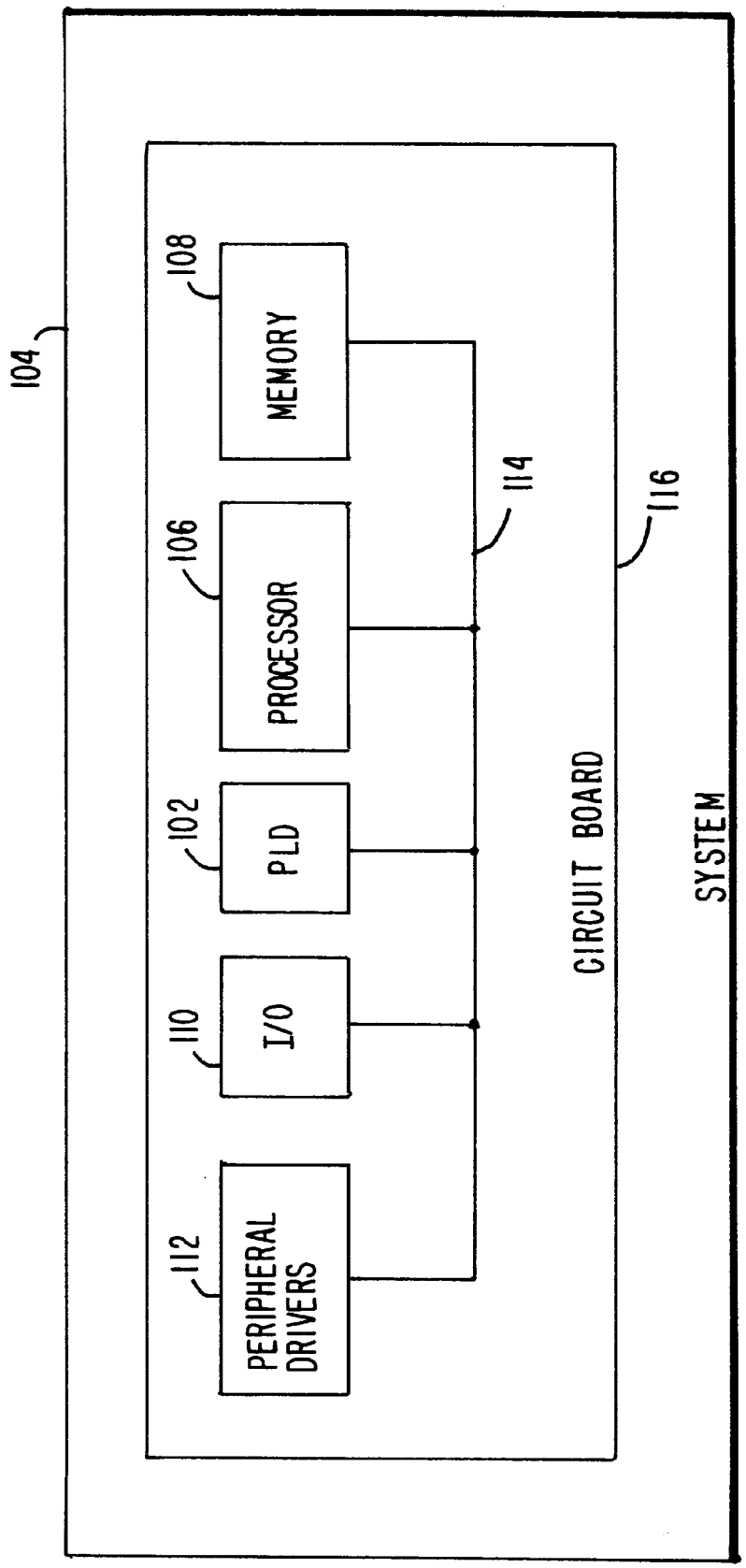
FIG. 7 is a diagram of a data processing system in which a programmable logic device having the redundancy circuitry of the present invention may be used.

The foregoing arrangements are typically used in programmable logic devices that are made part of larger systems. FIG. 7 shows a programmable logic device 102 containing the redundancy circuitry of this invention in use in a digital data processing system 104. Data processing system 104 may include one or more of the following components: a processor 106, memory 108, I/O circuitry 110, and peripheral drivers 112. These components are coupled together by a system bus 114 and populate a circuit board 116 that is contained in system 104.

System 104 may be used in a wide variety of applications, such as computer networking, data networking, instrumentation, video processing, digital signal processing, or any other application where the advantage of using programmable logic is desirable. Programmable logic device 102 may be used to perform a variety of different logic functions. For example, programmable logic device 102 may be configured as a processor or controller that works in cooperation with processor 106. Programmable logic device 102 may also be used as an arbiter for arbitrating access to a shared resource in system 104. In yet another example, programmable logic device 102 may be configured as an interface between processor 106 and one of the other components in system 104.

The programmable connections made between various components in the programmable logic devices of the present invention can be implemented in any of a wide variety of ways. For example, each programmable connection can be a relatively simple programmable connector such as a switch or a plurality of switches for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connection can use product term logic, implementing functions such as AND, NAND, OR, or NOR. Examples of components suitable for implementing programmable connections are erasable programmable read-only memories (EPROMs), electrically-erasable programmable read-only memories (EEPROMs), pass transistors, transmission gates, antifuses, laser fuses, metal optional links, etc. These programmable components may be controlled by various programmable function control elements or memory cells, which store the configuration data used to control the programmable components and various programmable logic circuits. Examples of suitable function control elements include static random-access memory (SRAM) cells, dynamic random-access memory (DRAM) cells, first-in first-out cells, EPROMs, EEPROMs, function control registers (e.g., as in Wahlstrom U.S. Pat. No. 3,473, 160), ferro-electric memories, fuses, antifuses, or the like. From the various examples mentioned above it will be seen that this invention is applicable both to one-time-only programmable and reprogrammable devices.

The foregoing is merely illustrative of the principles of this invention and various modifications can be made by those skilled in the art without departing from the scope and spirit of the invention.

What is claimed is:

1. A programmable logic device that may be repaired when a manufacturer determines that the device contains a defect, comprising:

a plurality of regular programmable logic regions and at least one spare programmable logic region arranged in a row;

a plurality of interleaved input multiplexer circuits each of which is connected between two adjacent logic regions in the row and which distributes input signals to those two logic regions, the programmable logic device having a plurality of columns each containing one of the interleaved input multiplexer circuits and one of the logic regions; and a bypass circuit associated with one of the columns for selectively bypassing the interleaved input multiplexer circuit and logic region in that column, the spare programmable logic region being used to replace circuitry in the bypassed logic region.

2. The programmable logic device defined in claim 1 further comprising:

a plurality of the bypass circuits each associated with a respective column for selectively bypassing the interleaved input multiplexer circuit and logic region in that column; and programming data shifting circuitry for shifting the programming data for the logic regions and interleaved input multiplexers into columns that do not contain defects when there is a defect in one of the columns.

3. The programmable logic device defined in claim 2 further comprising a normal set of output drivers in each column associated with the logic region in that column for providing output signals.

4. The programmable logic device defined in claim 3 further comprising output redirecting circuitry associated with each column for directing output signals from each logic region to either: (1) the normal drivers in the same column as the logic region when the programming data used in that logic region has not been shifted by the programming data shifting circuitry or (2) the normal drivers in an adjacent column when the programming data used in that logic region has been shifted from the adjacent column by the programming data shifting circuitry.

5. The programmable logic device defined in claim 2 further comprising:

drivers associated with each column for providing output signals from the logic region in each column; and programming data redirecting circuitry for redirecting the programming data for the drivers associated with a column containing a defect back to that column after that programming data has been shifted to another column by the programming data shifting circuitry.

6. The programmable logic device defined in claim 1 wherein the interleaved input multiplexer circuits each comprise two input multiplexer circuits, the programmable logic device further comprising a plurality of programmable multiplexers each associated with a respective one of the input multiplexer circuits.

7. The programmable logic device defined in claim 6 wherein each input multiplexer circuit comprises:

a plurality of conductors associated with the row of logic regions from which the input signals are distributed to the logic regions by the interleaved input multiplexer circuits;

a plurality of local vertical conductors connected to the conductors by the programmable multiplexers;

a plurality of local horizontal conductors that are selectively connected to the local vertical conductors; and at least one multiplexer that selectively connects one of the plurality of local horizontal conductors to one of the adjacent logic regions.

8. The programmable logic device defined in claim 1 wherein the bypass circuitry comprises at least one bypass multiplexer having one input that accepts signals from the interleaved input multiplexer in the same column and another input that accepts signals from the interleaved input multiplexer in a previous column, the output of the bypass multiplexer being provided to the spare logic region.

9. The programmable logic device defined in claim 1 wherein the logic regions comprise logic elements.

10. The programmable logic device defined in claim 9 further comprising multiple rows of logic elements.

11. The programmable logic device defined in claim 1 wherein the logic regions comprise logic array blocks each of which contains a number of logic elements.

12. The programmable logic device defined in claim 11 further comprising:

multiple rows of the logic array blocks; and multiple sets of the conductors, each set of the conductors being associated with a respective row of the logic array blocks.

13. The programmable logic device defined in claim 1 wherein the logic regions comprise logic array blocks each of which contains a number of logic elements, the programmable logic device further comprising:

two sets of the logic array blocks disposed in a row; and a spare logic array block disposed in the center of the row for use by either of the sets of logic array blocks in repairing defective circuitry.

14. A digital processing system comprising:

a processor;

a memory coupled to the processor; and a programmable logic device coupled to the processor and the memory, the programmable logic device being repairable when a manufacturer determines that the programmable logic device contains a defect, the programmable logic device having:

a plurality of regular programmable logic regions and at least one spare programmable logic region arranged in a row;

a plurality of interleaved input multiplexer circuits each of which is connected between two adjacent logic regions in the row and which distributes input signals to those two logic regions, the programmable logic device having a plurality of columns each containing one of the interleaved input multiplexer circuits and one of the logic regions; and a bypass circuit associated with one of the columns for selectively bypassing the interleaved input multiplexer circuit and logic region in that column, the spare programmable logic region being used to replace circuitry in the bypassed logic region.

15. The digital processing system defined in claim 14 further comprising a circuit board on which the memory, the processor, and the programmable logic device are mounted.

16. The digital processing system defined in claim 14 further comprising input/output circuitry coupled to the programmable logic device, the processor, and the memory.

17. The digital processing system defined in claim 14 further comprising peripheral drivers coupled to the programmable logic device, the processor, and the memory.

* * * * *